United States Patent [19]
Sim

[11] Patent Number: 5,825,809
[45] Date of Patent: Oct. 20, 1998

[54] DIGITAL FILTER HAVING AN ENERGY LEVEL DETECTOR FOR SELECTING A COEFFICIENT

[75] Inventor: Bok-tae Sim, Seoul, Rep. of Korea

[73] Assignee: Samsung Electronics Co., Ltd., Kyungki-Do, Rep. of Korea

[21] Appl. No.: 760,988

[22] Filed: Dec. 5, 1996

[30] Foreign Application Priority Data

Jan. 20, 1996 [KR] Rep. of Korea ..................... 1996-1204

[51] Int. Cl.$^6$ ............................................................
[52] U.S. Cl. .................. 375/200; 375/350; 364/724.011
[58] Field of Search ..................................... 375/200, 350, 375/207, 208, 342, 343, 354; 364/724.011, 724.19

[56] References Cited

U.S. PATENT DOCUMENTS

| | | | |
|---|---|---|---|
| 5,703,902 | 12/1997 | Ziv et al. ................................ | 375/200 |
| 5,703,903 | 12/1997 | Blanchard et al. ...................... | 375/350 |
| 5,732,114 | 3/1998 | Thebault et al. ......................... | 375/343 |

*Primary Examiner*—Melvin Marcelo
*Assistant Examiner*—Chi Ho Anrew Lee
*Attorney, Agent, or Firm*—Sughrue, Mion, Zinn, Macpeak & Seas, PLLC

[57] ABSTRACT

There is provided a base-band filter for use in a transmitter of a DS-CDMA system. The filter includes data storage for storing a plurality of sample data which are generated by the input signal sequentially delayed for a predetermined time, an energy level detector for determining whether the energy level of the input signal is equal to a current energy level to detect the location value at which a energy level is varied, comparing the location value of a sample data with the detected location value to select one of the current energy level and the previous energy level, and outputting the selected energy level as the energy level for the sample data, a coefficient selector for selecting a filter coefficient for the each sample data corresponding to the energy level selected by the energy level selector, a sign converter for converting the sign of the coefficient selected in the coefficient selector according to each sample data value stored in the data storage, and an adder for adding all the outputs of the sign converter and outputting the sum. A result of the present invention is that the amount of hardware required to realize the digital filter can be remarkably reduced.

13 Claims, 3 Drawing Sheets

5,825,809

DIGITAL FILTER HAVING AN ENERGY LEVEL DETECTOR FOR SELECTING A COEFFICIENT

BACKGROUND OF THE INVENTION

1. Field of the Invention

The present invention relates to a digital filter for use in a Code Division Multiple Access (CDMA) system using a Direct Sequence Spread Spectrum (DS/SS) (hereinafter, referred to as a DS-CDMA system), and more particularly, to a base-band filter used in a transmitter of a DS-CDMA system.

2. Description of the Related Art

A Finite Impulse Response (FIR) filter has a finite sequence of impulse responses and is generally non-recursive. Since a feedback loop is not needed in the non-recursive FIR filter, stability is guaranteed. In addition, since it can satisfy the specification of linear phase characteristic specifications, the FIR filter is widely used in applications including waveform transmission. On the other hand, an Infinite Impulse Response (IIR) filter generally achieves excellent amplitude characteristics by sacrificing phase characteristics. To obtain the same amplitude characteristics with a FIR filter as those of the IIR filter, many memories and coefficient multipliers are required. For example, the FIR filter must implement 100 or more terms of different orders to achieve acute cut-off characteristics.

A frequency or time domain specification is used in designing a FIR filter. When designing the FIR filter with a frequency domain specification, a window function method and a frequency sampling method are used. In the former, the coefficients of the FIR filter are determined by approximating infinite impulse responses of an ideal filter to finite impulse responses, whilst in the latter the coefficients are determined by sampling amplitude characteristics given as a design specification with respect to frequency and approximating the sampled data.

In a DS-CDMA system, data to be transmitted is spread across frequency bands by using a band-spreading psuedo-random noise (PN) code and the result thereof, a band-spreaded signal, is filtered in accordance with an RF bandwidth, to thereby transmit the data.

A general base-band filter receives an N-multibit signal, delays that signal, multiplies each delayed sample by its corresponding M-bit coefficient to produce a product, and adds all the product values. Thus, given an N-bit input signal, an M-bit filter coefficient, and T filter taps, T unit N×M multipliers, T unit N-bit registers for storing input samples, and an adder are needed to implement such a general base-band filter.

FIG. 5 is a schematic block diagram of a FIR filter with a one-bit input signal. In a DS-CDMA system, a one-bit input signal is used in many cases. In this case, each sample $D_0, D_1, \ldots, D_{N-1}$ of the input signal merely indicates a sign, where D indicates a delay. Therefore, the output of the filter is obtained by converting the signs of each coefficient $C_0, C_1, \ldots, C_{N-1}$ with an adding/subtracting unit 55, without using a multiplier, and then adding the resulting values in an adder 67, thereby remarkably reducing the amount of hardware required to realize the filter.

Meanwhile, an output data rate of voice CODEC varies in four ways depending on the state of a caller's voice, and the bit energy varies with the data rate in a CDMA system for a digital cellular system set up according to an IS-95 standard, as suggested by Qualcomm. When the data rate is 9600 bps (bits per second), a reference bit energy Eb is transmitted, and Eb/2 is transmitted for 4800 bps, Eb/4 for 2400 bps, and Eb/8 for 1200 bps. When the bit energy is changed, the magnitude of an input signal should be varied to conform with the energy variation. Since a signal input to the baseband filter has four different magnitude levels. The above-described method for realizing an FIR filter with a one-bit input signal cannot be applied to this situation. Furthermore, assuming that the magnitude of the signal with respect to Eb is A, the magnitude of the input signal should be set to $A/\sqrt{2}$ for Eb/2, A/2 for Eb/4, and $A/2\sqrt{2}$ for Eb/8. Here, to accurately represent the value of $1/\sqrt{2}$, eight or more bits are required for expressing the input signal. Therefore, a considerable amount of hardware is needed to implement a filter using multipliers in view of such features.

SUMMARY OF THE INVENTION

It is an object of the present invention to provide an energy level detecting device for each sample of an input signal, when the energy level of the signal input to a digital filter varies at most once in a filter window.

It is another object of the present invention to provide a device for selecting a filter coefficient applied to each sample data when a signal input to a digital filter has a plurality of magnitude levels (M=P×Q), each of which is divided into reference levels P and Q, in which the magnitude levels are multiples of the reference levels by a predetermined number.

It is still another object of the present invention to provide a digital filter for filtering an input signal, when the signal input to the digital filter has a plurality of discrete energy levels and the energy level of the input signal varies at most once in a filter window.

Yet another object of the present invention is to provide a method for filtering samples of an input signal which has a plurality of discrete energy levels which vary at most once during a filter window.

To achieve the first object, there is provided an input signal energy detecting device for detecting an energy level of sample data of an input signal when an energy level of the input signal varies at most once within a filter window, comprising: a first storing unit for storing first and second energy levels of the input signal; an energy detecting unit for updating said second energy level with said first energy level and updating said first energy level with a current energy level of the input signal, and generating a detected edge location value within the filter window at which an energy level variation of the input signal occurs, when said current energy level of the input signal is different from said first energy level; and an energy level selector for comparing a location value of one of the sample data of the input signal with said detected edge location value, and selecting one of said first and second energy levels so as to output said selected value as an energy level for said sample data.

To achieve the second object, there is provided a device for selecting a filter coefficient applied to each sample data of an input signal where the input signal has a plurality of magnitude levels (M=P×Q), each of which is divided into a plurality of reference levels P and Q, each of the magnitude levels being predetermined multiples of the reference levels, the filter coefficient selecting device comprising: a coefficient storing unit for storing a plurality of filter coefficients corresponding to said plurality of reference levels of said input signal; a first selector for selecting one of the plurality of filter coefficients stored in said coefficient storing unit and outputting the selected filter coefficient; and a second selector for shifting the selected filter coefficient and outputting a shifted filter coefficient for said sample data when the magnitude level of each sample data is a predetermined multiple of the reference levels.

To achieve the third object, there is provided a digital filter for filtering samples of an input signal which has a plurality of discrete energy levels which vary at most once during a filter window, said digital filter comprising: a storage unit for storing a plurality of sample data generated from said input signal which are sequentially delayed for a predetermined time; an energy level selector for determining whether an energy level of said input signal is equal to a current energy level and detecting the location value at which a energy level is varied, comparing a location value of one of the sample data with the detected location value to select one of the current energy level and a previous energy level, and outputting the selected energy level as an energy level for said sample data; a coefficient selector for selecting a filter coefficient for said each sample data corresponding to said energy level selected by said energy level selector; a sign converter for converting a sign of said coefficients selected by said coefficient selector according to each sample data value stored in said storing unit; and an adder for adding the outputs of said sign convertor and outputting a sum.

To achieve the fourth object, there is provided a method for filtering samples of an input signal which has a plurality of discrete energy levels which vary at most once during a filter window, said method comprising: detecting an edge location which is a location in the input data at which the energy level of the input signal varies and storing a previous energy level of the input signal before the detected energy level variation and storing a current energy level of the input signal after detection of the variation of the energy level; generating an energy code corresponding to one of the previous energy level and the current energy level, based on the detected edge location and a predetermined location in the samples of the input signal; selecting a coefficient from one of a plurality of coefficients stored in a memory unit, based on the energy code; and scaling the selected coefficient based on the energy code to generate a scaled coefficient.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENT

The present invention is directed to realization of a FIR filter for efficiently filtering a band-spreaded signal which has several different energy levels depending on a data rate. In a digital cellular CDMA system, the bit energy of an input signal varies among four levels in each predetermined section of the signal, i.e., a frame. The levels of the input signal are given as A, A/2, A/$\sqrt{2}$, and A/2$\sqrt{2}$. Since the levels A and A/$\sqrt{2}$ are twice the value of A/2 and A/2$\sqrt{2}$, respectively, A/2 and A/2$\sqrt{2}$ can be easily obtained by shifting data values representing levels A and A/$\sqrt{2}$ by one bit.

Figure 1:
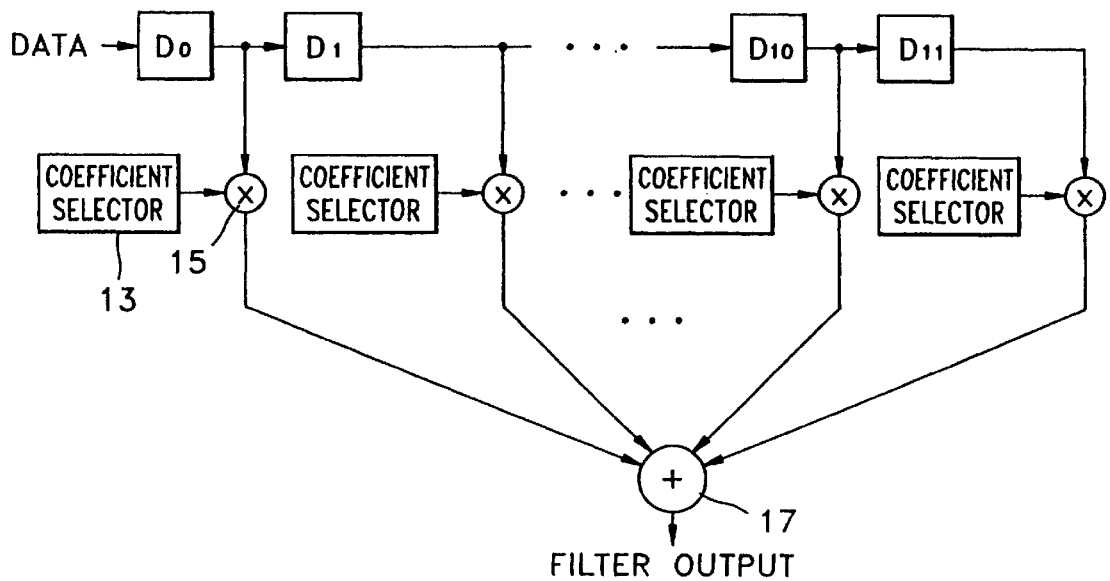
FIG. 1 is a schematic block diagram of a digital filter according to the present invention.

FIG. 1 is a schematic block diagram of a digital filter according to the present invention. This embodiment describes a base-band FIR filter with 48 taps and which employs four-fold oversampling for use in a transmitter of a digital cellular CDMA system in which the bit energy of an input signal varies among four levels in each predetermined section, i.e., a frame.

Input signal data is comprised of a plurality of sample data $D_0, D_1, \ldots, D_{11}$ which are sequentially delayed for a predetermined time and stored in memory corresponding to each delay. A coefficient selector 13 compares the energy level of an input signal with a current energy level in order to detect a location in the data at which the energy level varies. Coefficient selector 13 also compares the location of the sample data with the detected location in order to select either the current energy level or the previous energy level, and it outputs the selected level as the energy level for the sample data. Coefficient selector 13 then selects a filter coefficient for each sample data depending on the selected energy level. An operator 15 converts the sign of the coefficient selected by coefficient selector 13 according to each sample data.

Figure 2:
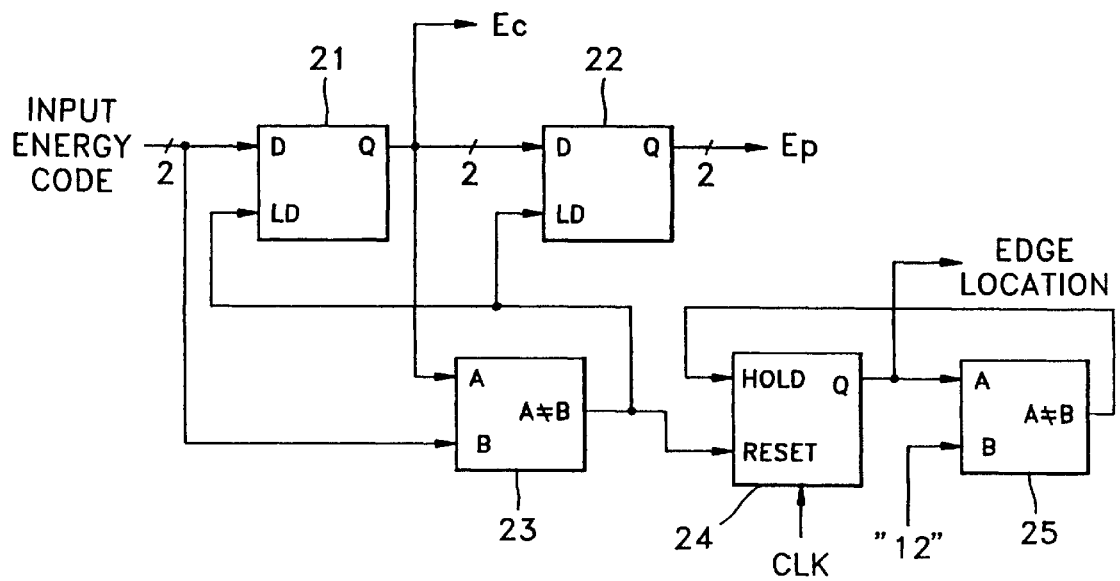
FIG. 2 is a schematic block diagram of an energy detecting device according to the present invention.

FIG. 2 is a schematic block diagram of a device for detecting the energy level of each sample data when the energy level of an input signal varies at most once in a digital filter window, according to the present invention. The input signal is an energy code obtained by coding an energy level.

A first flip-flop 21 updates its value stored therein with a current energy level Ec when the energy level of the input signal is input via an input terminal D and a control signal is input to a load terminal LD. A first comparator 23 determines whether the energy level of the input signal is equal to that stored in first flip-flop 21, and generates a control signal to update the data stored in the first flip-flop 21 and a second flip-flop 22 when the compared energy levels are different (A≠B). The control signal is applied to load terminals LD of the first and the second flip-flops, 21 and 22, respectively. Second flip-flop 22 stores the previous energy level Ep stored in first flip-flop 21 when the output Q of first flip-flop 21 is input via input terminal D and the control signal is input to load terminal LD of second flip-flop 22. A third flip-flop 24 is reset when first comparator 23 determines that the compared energy level values are different. Third flip-flop 24 increments the value stored therein by one based on a clock CLK, and maintains its current value when a hold signal HOLD is input. Third flip-flop 24 thereby generates a value indicative of an edge location at which energy level variation is detected. A second comparator 25 determines whether the output Q of third flip-flop 24 is equal to a predetermined value, e.g., "12", corresponding to the number of sample data. Second comparator 25 generates a control signal to prevent a further increase in the value stored in third flip-flop 24 when the compared values are equal (A=B), in which the control signal is applied to the hold terminal HOLD of third flip-flop 24.

Figure 3:
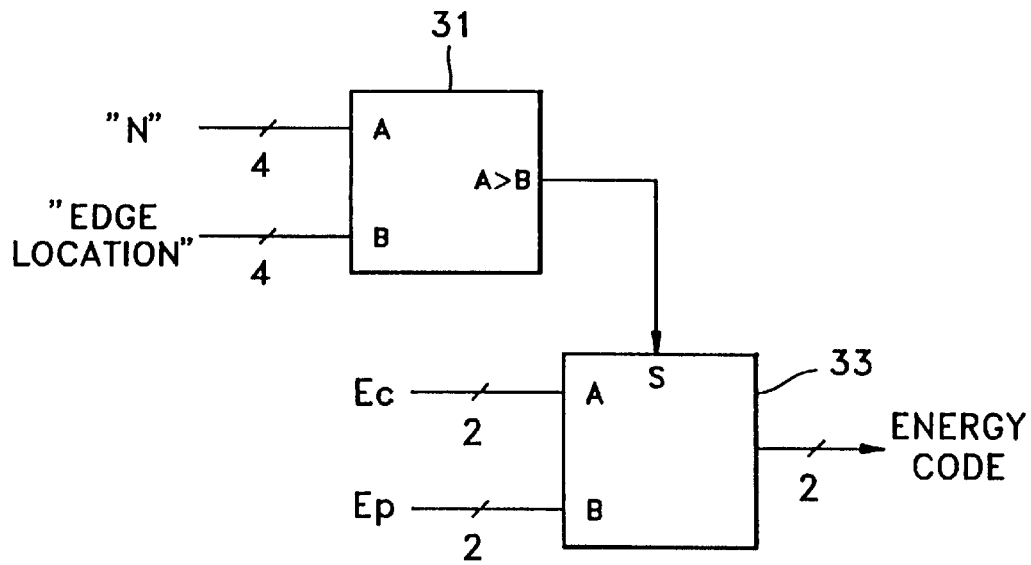
FIG. 3 is a schematic block diagram of an energy code generating device using an edge location value from the device shown in FIG. 2.

FIG. 3 is a schematic block diagram of an energy code generating device using the edge location value output from third flip-flop 24 of the circuit shown in FIG. 2. Here, an energy code is used as a control signal for selecting a filter coefficient.

A comparator 31 compares a location value "N" of a sample data with the edge location value in order to generate a control signal for selecting an energy code for the sample data. Comparator 31 outputs the control signal to a selection terminal S of a multiplexer MUX 33 which selects one of a current energy code Ec and the previous energy code Ep according to the control signal applied to the selection terminal S. MUX 33 outputs the selected energy code as an energy code for the sample data. That is, if "N" is larger than the edge location value input to comparator 31, MUX 33 selects the previous energy code Ep, otherwise, the current energy code Ec is selected. MUX 33 outputs the selected energy code as energy codes E1 and E0 for the Nth sample data, where E0 is the first bit of the two-bit energy code and E1 is the second bit of the two-bit energy code. Here, the generated energy code is supplied to a filter coefficient selecting device to be described later.

Figure 4:
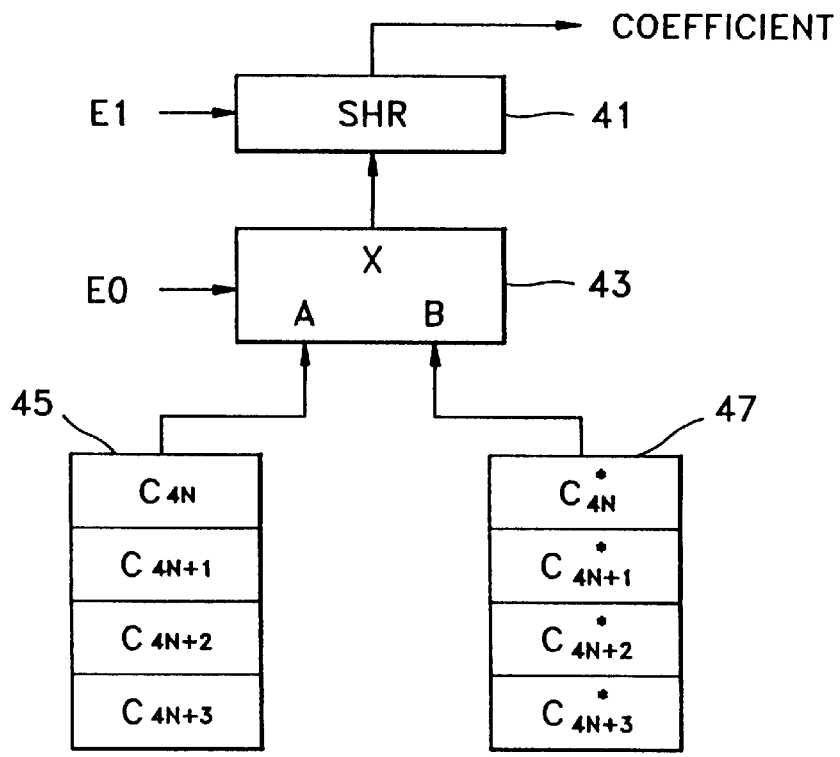
FIG. 4 is a schematic block diagram of a filter coefficient selecting device for a digital filter according to the present invention.
Figure 5:
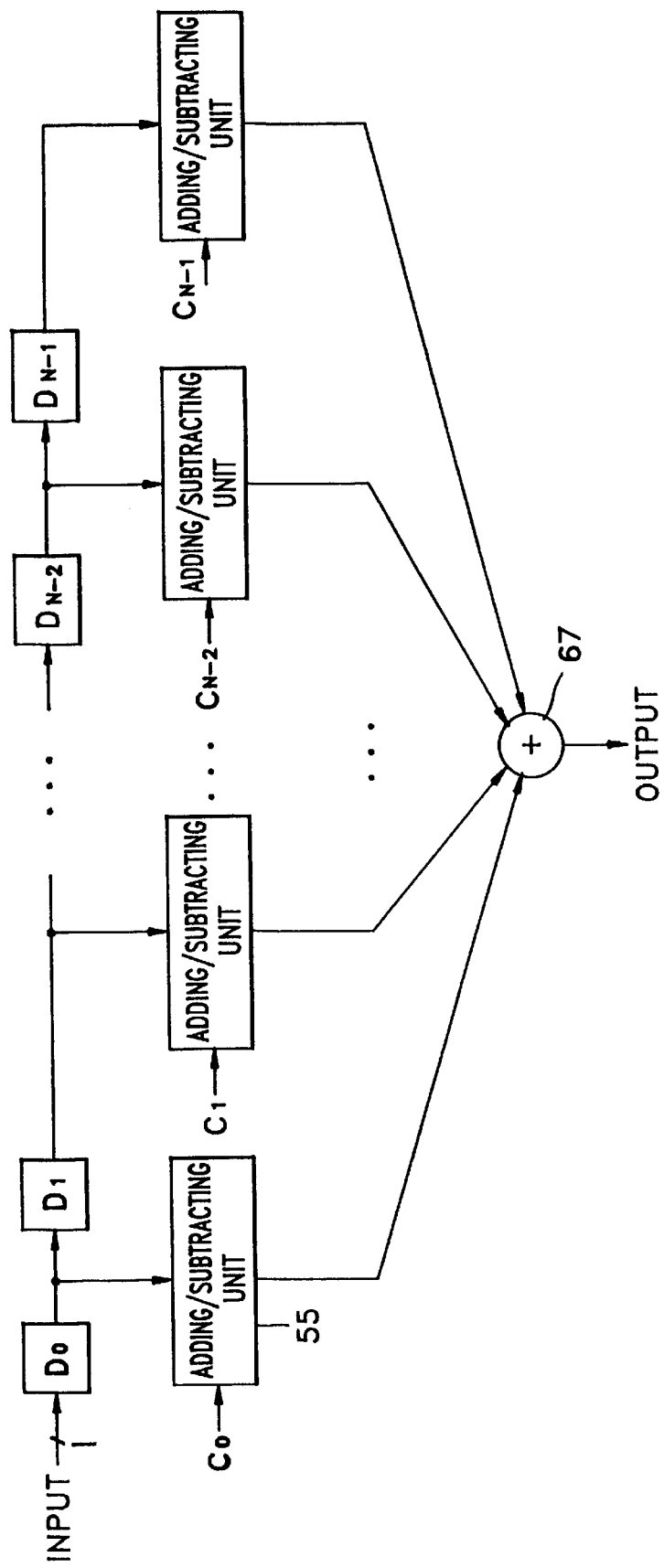
FIG. 5 is a schematic block diagram of a previously proposed FIR filter with a one-bit input signal.

FIG. 4 is a schematic block diagram of a device for selecting a filter coefficient for a sample data in the digital filter according to the present invention, when an input signal has a plurality of magnitude levels (M=P×Q) each of which is divided into a plurality of reference levels P and Q being predetermined multiples of each reference level. In FIG. 4, reference numeral 41 denotes a bit shifter for shifting an input digital data by a predetermined number of bits. Reference numeral 43 denotes a multiplexer (MUX) for selecting one of input signals according to a control signal. Reference numerals 45 and 47 denote memories for storing filter coefficients.

Memories 45 and 47 store a plurality of filter coefficients corresponding to a plurality of reference levels which an input signal possibly has. The MUX 43 selects one of the filter coefficients stored in memories 45 and 47 depending on the reference level of each sample data. The bit shifter 41 shifts the filter coefficient selected in MUX 43 by a predetermined number of bits when the magnitude level of each sample data is a predetermined multiple of the reference level, and outputs the shifted coefficient as a filter coefficient for the sample data.

In this embodiment, to process an input signal having four levels A, A/2, A/√2 and A/2√2, memories are constructed as follows. The first memory 45 is a register for storing a filter coefficient for level A, and the second memory 47 is a register for storing a filter coefficient for A/2√2. Both registers output data one by one successively from $C_{4N}$ to $C_{4N+3}$ and from $C_{4N}$ to $C_{4N+3}$, respectively, while an oversampling counter (not shown) repeatedly counts from 0 to 3.

The MUX 43 selects one of C and C' output from memories 45 and 47 according to the value of bit 0 (E0) of the energy code, and the bit shifter 41 shifts the output of the MUX to the right according to the value of bit 1 (E1) of the energy code. That is, since in case of level values of A/2 and A/2√2, the energy code bit 1 E1 is one, the bit shifter 41 shifts the output of the MUX 43 to the right, thereby performing a one-half scaling operation (i.e., a divide-by-two operation).

The relationship between an energy code and a level value is shown in the following table 1.

TABLE 1

| Energy Code E1, E0 | Level |
|---|---|
| 00 | A |
| 01 | A/ $\sqrt{2}$ |
| 10 | A/2 |
| 11 | A/2 $\sqrt{2}$ |

According to the present invention, the amount of hardware required for realization of a filter can be remarkably reduced by storing two sets of coefficients and selecting a coefficient from among the two sets of coefficients according to an energy code, thereby allowing the filter to be implemented with FIR filters which use a one-bit input signal. Furthermore, only the current and previous energy codes are stored and an edge location is varied by detecting an energy edge location instead of storing an energy code for the duration of a filter window. Consequently, the number of required flip-flops can be reduced. Moreover, the required amount of hardware can be markedly reduced especially when data from several channels is processed with a time division method using a single filter.

While the present invention has been described and illustrated with reference to a preferred embodiment thereof, it is to be readily understood that the present invention is not limited to the embodiment, and various changes and modifications can be made therein without departing from the spirit and scope of the invention defined in the appended claims.

What is claimed is:

1. An input signal energy detecting device for detecting an energy level of sample data of an input signal when an energy level of the input signal varies at most once within a filter window, comprising:

a first storing unit for storing first and second energy levels of the input signal;

an energy detecting unit for updating said second energy level with said first energy level and updating said first energy level with a current energy level of the input signal, and generating a detected edge location value within the filter window at which an energy level variation of the input signal occurs, when said current energy level of the input signal is different from said first energy level; and an energy level selector for comparing a location value of one of the sample data of the input signal with said detected edge location value, and selecting one of said first and second energy levels so as to output said selected value as an energy level for said sample data.

2. The input signal energy detecting device according to claim 1, wherein said energy level selector comprises:

a comparator for comparing the location value of said one of the sample data with said detected edge location value and generating a control signal for selecting an energy code for said sample data; and a selector for selecting one of the second energy code and the first energy code according to the control signal generated by said comparator, and outputting the selected energy code as an energy code for said sample data, wherein said first energy code corresponds to the first energy level and the second energy code corresponds to the second energy level, and wherein the energy code for said sample data corresponds to the selected energy level for the sample data.

3. The input signal energy detecting device according to claim 1, wherein the input signal energy detecting device is employed in a digital filter which delays the input signal for a predetermined amount of time, multiplies each delayed sample data by a corresponding filter coefficient to produce a product, adds the products produced for each sample data to produce a sum, and outputs the sum.

4. A device for selecting a filter coefficient applied to each sample data of an input signal where the input signal has a plurality of magnitude levels (M=P×Q), each of which is divided into a plurality of reference levels P and Q, each of the magnitude levels being predetermined multiples of the reference levels, the filter coefficient selecting device comprising:

a coefficient storing unit for storing a plurality of filter coefficients corresponding to said plurality of reference levels of said input signal;

a first selector for selecting one of the plurality of filter coefficients stored in said coefficient storing unit and outputting the selected filter coefficient; and a second selector for shifting the selected filter coefficient and outputting a shifted filter coefficient for said sample data when the magnitude level of each sample data is a predetermined multiple of the reference levels.

5. The device for selecting a filter coefficient according to claim 4, wherein the device is employed in a digital filter which delays the input signal for a predetermined amount of time, multiplies each delayed sample data by a corresponding filter coefficient to produce a product, adds the products produced for each sample data to produce a sum, and outputs the sum.

6. The device for selecting a filter coefficient according to claim 4, wherein said first selector selects one of the plurality of filter coefficients based on an energy code corresponding to an energy level of the input signal, and said second selector shifts the selected filter coefficient based on the energy code.

7. A digital filter for filtering samples of an input signal which has a plurality of discrete energy levels which vary at most once during a filter window, said digital filter comprising:

a storage unit for storing a plurality of sample data generated from said input signal which are sequentially delayed for a predetermined time;

an energy level selector for determining whether an energy level of said input signal is equal to a current energy level and detecting the location value at which a energy level is varied, comparing a location value of one of the sample data with the detected location value to select one of the current energy level and a previous energy level, and outputting the selected energy level as an energy level for said sample data;

a coefficient selector for selecting a filter coefficient for said each sample data corresponding to said energy level selected by said energy level selector, a sign converter for converting a sign of said coefficients selected by said coefficient selector according to each sample data value stored in said storing unit; and an adder for adding the outputs of said sign convertor and outputting a sum.

8. The digital filter according to claim 7, wherein said energy level selector comprises:

a first storing unit for storing first and second energy levels of the input signal;

an energy detecting unit for updating said second energy level with said first energy level and updating said first energy level with a current energy level of the input signal, and generating a detected edge location value within the filter window at which an energy level variation of the input signal occurs, when said current energy level of the input signal is different from said first energy level; and a first selector for comparing a location value of one of the sample data of the input signal with said detected edge location value, and selecting one of said first and second energy levels so as to output said selected value as an energy level for said sample data.

9. The digital filter according to claim 8, wherein said coefficient selector comprises:

a comparator for comparing the location value of said one of the sample data with said detected edge location value and generating a control signal for selecting an energy code for said sample data; and a second selector for selecting one of the second energy code and the first energy code according to the control signal generated by said comparator, and outputting the selected energy code as an energy code for said sample data, wherein said first energy code corresponds to the first energy level and the second energy code corresponds to the second energy level, and wherein the energy code for said sample data corresponds to the selected energy level for the sample data.

10. A method for filtering samples of an input signal which has a plurality of discrete energy levels which vary at most once during a filter window, said method comprising:

detecting an edge location which is a location in the input data at which the energy level of the input signal varies and storing a previous energy level of the input signal before the detected energy level variation and storing a current energy level of the input signal after detection of the variation of the energy level;

generating an energy code corresponding to one of the previous energy level and the current energy level, based on the detected edge location and a predetermined location in the samples of the input signal;

selecting a coefficient from one of a plurality of coefficients stored in a memory unit, based on the energy code; and scaling the selected coefficient based on the energy code to generate a scaled coefficient.

11. The method according to claim 10, further comprising:

delaying one of the samples by a predetermined amount of time;

multiplying the delayed sample by the scaled coefficient to output a product; and adding the product with other products generated based on other ones of the samples of the input data to output a sum, wherein the sum is a filtered output.

12. The method according to claim 10, wherein said scaling of the selected coefficient is performed by shifting the selected coefficient based on the energy code.

13. The method according to claim 11, wherein said scaling of the selected coefficient is performed by shifting the selected coefficient based on the energy code.

* * * * *